United States Patent [19]

Karashima

[11] Patent Number: 4,870,474
[45] Date of Patent: Sep. 26, 1989

[54] LEAD FRAME

[75] Inventor: Akira Karashima, Kawaguchi, Japan

[73] Assignee: Texas Instruments Incorporated, Dallas, Tex.

[21] Appl. No.: 127,721

[22] Filed: Dec. 2, 1987

[30] Foreign Application Priority Data

Dec. 12, 1986 [JP] Japan .................................. 61-295783

[51] Int. Cl.⁴ ..................... H01L 23/12; H01L 23/54; H01L 23/10
[52] U.S. Cl. ......................................... 357/70; 357/68
[58] Field of Search ................. 357/70, 68; 174/52 FP

[56] References Cited

U.S. PATENT DOCUMENTS

| | | | |
|---|---|---|---|
| 3,902,148 | 8/1975 | Drees et al. ........................... | 357/70 |
| 4,109,096 | 8/1978 | Dehaine ............................... | 357/70 |
| 4,380,042 | 4/1983 | Angelucci, Sr. et al. ............ | 357/70 |
| 4,400,714 | 8/1983 | Brown .................................. | 357/70 |
| 4,496,965 | 1/1985 | Orcutt et al. . | |
| 4,721,993 | 1/1988 | Walter .................................. | 357/70 |

FOREIGN PATENT DOCUMENTS

| | | | |
|---|---|---|---|
| 52-12573 | 1/1977 | Japan ..................................... | 357/70 |
| 55-162251 | 12/1980 | Japan ..................................... | 357/70 |
| 58-48953 | 3/1983 | Japan ..................................... | 357/70 |
| 61-5557 | 1/1986 | Japan ..................................... | 357/70 |
| 61-166054 | 7/1986 | Japan ..................................... | 357/70 |

Primary Examiner—Rolf Hille
Assistant Examiner—S. V. Clark
Attorney, Agent, or Firm—William E. Hiller; N. Rhys Merrett; Melvin Sharp

[57] ABSTRACT

A lead frame composed of an outer frame and inner lead frame portions formed as an integral frame wherein each lead frame portion directly joins the outer frame at some of the four corners of the lead frame portion with circuitous bridges interposed for fixation of the lead frame portion to the outer frame at each of the other corners.

4 Claims, 3 Drawing Sheets

LEAD FRAME

BACKGROUND OF THE INVENTION

1. Field of the Invention

This invention relates to a lead frame and particularly to one used to package a semiconductor integrated circuit (IC) chip or chips.

2. Description of the Prior Art

To package IC chips a lead frame 1 as shown in FIG. 1 has hitherto been used. A blank metal sheet made of copper is etched or otherwise cut to form the lead frame 1 as an integral unit which is composed of an outer frame 2 and inner lead frame portions 8 where leads 7 radiate in all directions. On each side of a lead frame portion 8, outer leads 6 are connected through narrow straight strips 9 and 10. These strips join the outer frame 2 at the corners of the lead frame portion 8. Leads extending from the corners of the mount pad 11 are for mounting an IC chip (not shown) thereon and join the outer frame 2 at the corners of the lead frame portion 8.

Accordingly, the lead frame 1 of FIG. 1 has the lead frame portion 8 directly connected to the outer frame 2 at each corner. It is noted that after IC packaging, the area encircled by a profile 3 is sealed in resin; A hole 4 is used position the lead frame 1.

If the lead frame 1 is passed across a process step that is involved in such as the chip bonding step, there will appear temperature differences between the lead frame portion 8 and outer frame 2, and result in deformation of leads 6 and 7. This impairs the position accuracy. As the resin cast in the region 3 shrinks, leads 6 are forcibly pulled on all the four sides of the lead frame region 8 because of different thermal expansion coefficients of the resin and lead frame, which results in deformations at points 1, 2, and 6. Such deformations not only make it difficult to convey the lead frame smoothly to subsequent steps of the production line but also cause slipping of leads 7 in the cast resin leading to poor moistureproof performance and less reliability of the product.

OBJECTS AND SUMMARY OF THE INVENTION

Accordingly, an object of the invention is to provide a lead frame that is subject to deformation under thermal stresses and is capable of maintaining positional accuracy and conveyability with stresses exerted by cast resin being absorbed for further reduction in deformation that improves the product IC package in moistureproof performance and in reliability.

Namely, the invention relates to a lead frame composed of an outer frame and an inner lead frame portion as an integral frame wherein each lead frame portion directly joins the outer frame at some of the four corners of the lead frame portion and more particularly at a single corner with meandering bridges interposed for connection of such portion to the outer frame at each of the other corners.

Other objects, features and advantages of the invention will appear more fully from the following detailed description taken in connection with the accompanying drawings.

DESCRIPTION OF THE PREFERRED EMBODIMENTS

Figure 1:
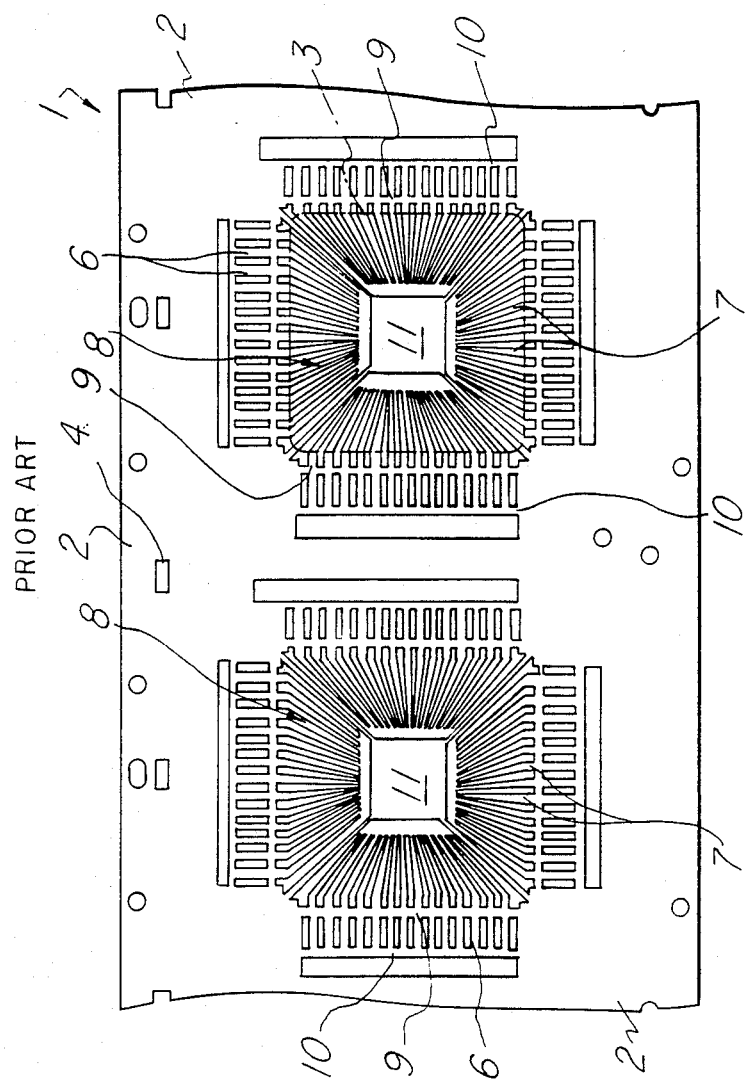
FIG. 1 is a plan view of a section of a lead frame of prior art.
Figure 2:
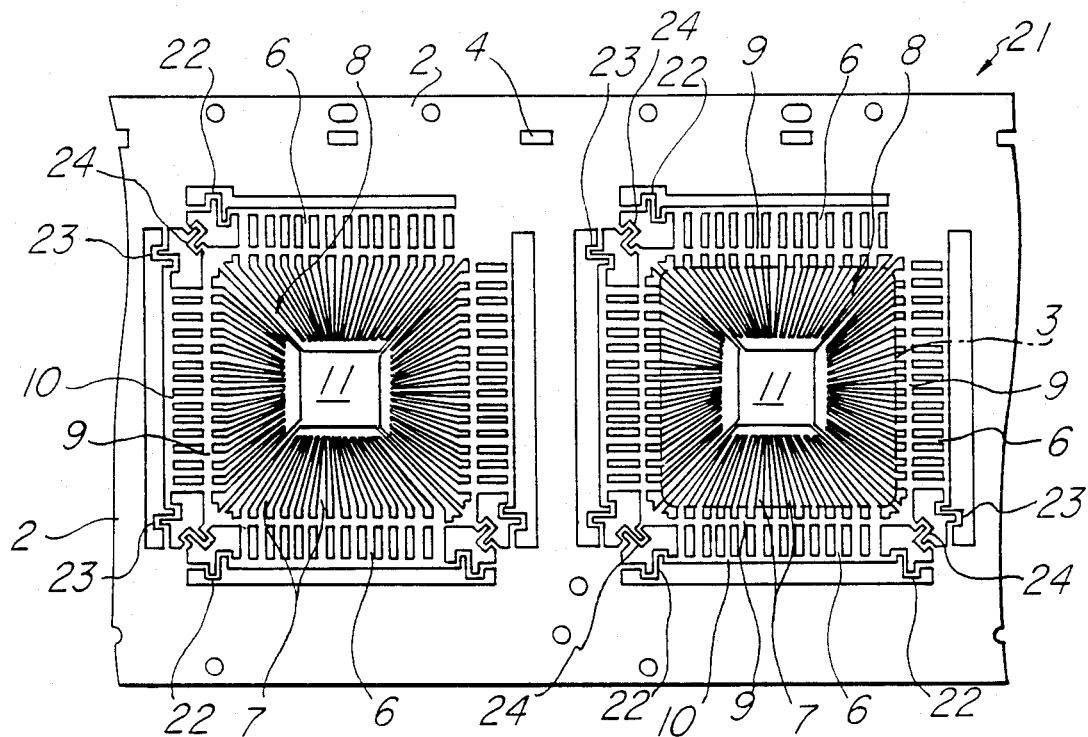
FIG. 2 is a plan view of a section of a lead frame embodying the invention.
Figure 3:
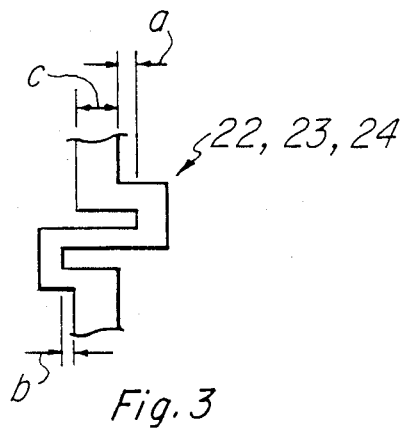
FIG. 3 is an enlarged detail of one of the meandering bridges of the lead frame of FIG. 2.

FIG. 2 is an embodiment a lead frame according to the invention where common parts that appear in both FIGS. 1 and 2 are individually identified by common numbers. A unique construction of this lead frame 21 is that unlike the embodiment of FIG. 1 the lead frame portion 8 directly joins the outer frame 2 only at one of the four corners (top right corner in the FIG. 2) while meandering bridges 22, 23 and 24 are interposed to fix the lead frame portion 8 to the outer frame 2 at each of the other three corners. All these meandering bridges are configured to the same shape as shown in the enlarged detail of FIG. 3. In the above Figure, both dimensions "a" and "b" are preferably not negative because it is important that these bridges can deform resiliently up and down, right and left or obliquely in the Figure and also perpendicular to the Figure. Practically, assuming 0.8 to 1.2 mm for the width "c" of the root section of bridge, the gaps "a" and "b" are preferably 0.5 to 0.8 mm and more preferably 1.0 to 1.5 mm.

If a lead frame 21 has a lead frame portion 8 that directly joins the outer frame at one of the four corners with meandering bridges 22, 23, and 24 interposed at each of the other corners for fixing the lead frame portion 8 to the outer frame 2 and is passed across the aforementioned heat generating process step with the outer frame 2 and lead frame portion 8 being heated to different temperatures, stresses that might have been produced in the vertical and transverse directions in FIG. 2 will be effectively absorbed by elastic deformations of meandering bridges 22, 23, and 24. As a result, the lead frame portion 8 itself improves in dimensional and positional accuracy with respect to the width of individual gaps between leads. Further, being freed from distortion, the lead frame itself improves in conveyability for flowing smoothly through the production line. Further, as resin shrinks in the cast area encircled by the profile 3 sealing a mounted IC chip, any tension applied to leads 6 and 7 will be absorbed by deformation of the meandering bridges 22, 23 and 24. For this reason, the lead frame is freed from any distortion or deformation and slip of leads 7 in the resin mold is suppressed, resulting in an improvement in moistureproof performance and reliability.

Figure 4A:
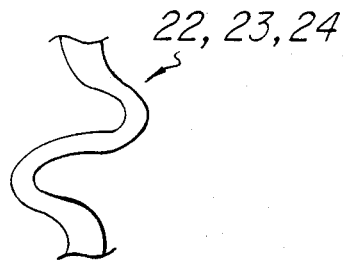
FIGS. 4 (A) and (B) are enlarged details of another additional embodiments of the meandering bridge.
Figure 4B:
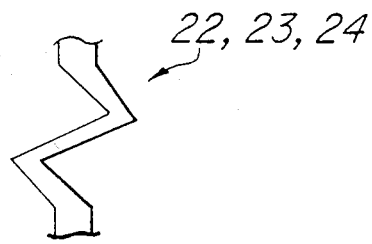

FIG. 4 (A) and (B) are another two examples of the shape of the meandering bridges 22, 23, and 24. Both examples can exert the effects as mentioned above.

Figure 5:
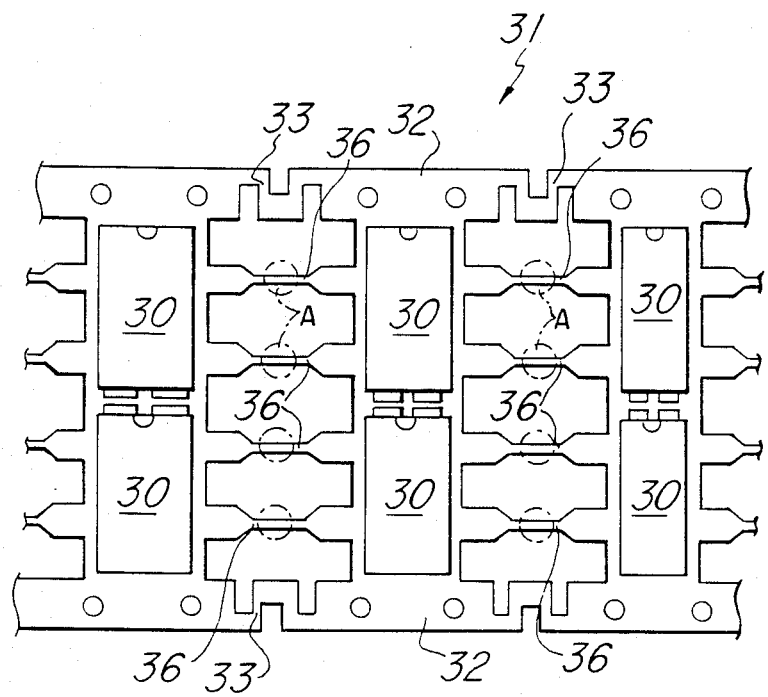
FIG. 5 is a plan view of a second embodiment of a lead frame to; according to the invention is applied.

An application of the idea of the meandering bridges 22, 23, and 24 is a lead frame 31 as shown in FIG. 5. In the case where resin is cast for packaging in a plurality of areas 30 on a single piece of lead frame 31, the entire lead frame is freed from stresses and thereby maintains the flatness, the outer frame 32 of this lead frame can be designed to have meandering bridges 33. Such meandering bridges are preferably provided between individual resin cast areas (resin sealed units) along the length of lead frame. Meandering bridges 33 may also be provided at points A of leads 36 disposed between individual resin cast areas.

It will be evident that various modifications can be made to the described embodiments without departing from the scope of the present invention.

For example, though three meandering bridges 22, 23, and 24 are provided at each corner in the above example, two or four or more bridges may be disposed per corner instead and these bridges may be disposed in different directions. Further, though in the example the lead frame portion directly joins the outer frame only at a single corner but such direct joining is not limited to a single corner. It is noted that the idea of the present invention can be applied to a lead frame for the dual inline package beside the lead frame as mentioned above, with leads directed toward four sides of each lead frame portion.

As mentioned above, the idea of the invention is that the lead frame portion directly joins the outer frame at a given corner or corners with meandering bridges interposed at each of the other corners for fixation to the outer frame. At a heating process step, therefore, even if the outer frame and lead frame portion are heated to different temperatures, stresses are effectively absorbed by elastic deformation of such meandering bridges. As a result, the lead frame portion itself improves in the dimensional and positional accuracy while the entire lead frame, being free from any distortion, improves in conveyability being capable of flowing smoothly along the production line. Further, as resin that is cast for IC chip sealing shrinks generating forces to pull leads, these forces are absorbed by deformation of the above meandering bridges. Accordingly, the lead frame is protected from any distortion or deformation. Further since leads do not slip in the resin mold, there is an improvement in moistureproof performance and thereby in reliability of the product IC package.

What is claimed is:

1. A lead frame comprising:
   an outer frame;
   an inner lead frame portion having a plurality of corners and being surrounded by said outer frame, said inner lead frame portion including a marginal rim extending about the periphery of the inner lead frame portion and a plurality of inwardly extending elongated conductor leads integrally formed at their outer ends with said marginal rim and having their inner ends free for interconnect purposes;
   said outer frame and said inner lead frame portion lying in a common plane and having corresponding widthwise and lengthwise directions;
   a plurality of bridges respectively disposed only in at least some of the corners of said inner lead frame portion, each of said bridges being of sinuous structure and extending between the corresponding corner of said inner lead frame portion and said outer frame and having its opposite ends integrally formed with the corresponding corner of said inner lead frame portion and said outer frame respectively;
   said plurality of sinuous bridges comprising a respective set of first, second and third sinuous bridges located at each of said at least some of the corners of said inner lead frame portion;
   said second and third sinuous bridges of each set extending in the widthwise direction and the lengthwise direction respectively;
   said first sinuous bridge of each set being interposed between said second and third sinuous bridges in spaced relation thereto and extending in a diagonal direction; and
   each of said sinuous bridges being subject to elastic deformation for absorbing temperature stresses to which the outer frame and the inner lead frame portion may be subjected, whereby the occurrence of stresses in the plurality of elongated conductor leads of said inner lead portion is minimized.

2. A lead frame as set forth in claim 1, wherein each of said sinuous bridges is elastically deformable in a lengthwise and widthwise direction of said inner lead frame portion and in a direction normal to the plane in which said inner lead frame portion lies.

3. A lead frame as set forth in claim 2, wherein said inner lead frame portion has four sides, the intersection between adjacent sides defining a respective corner of said inner lead frame portion; and said inner lead frame portion further including
   a lead extension structure integral with said marginal rim and respectively extending outwardly from each of the four sides of said inner lead frame portion, each of said lead extension structures having a plurality of lead extensions, individual lead extensions being in registration with corresponding ones of said plurality of elongated conductor leads;
   said second and third sinuous bridges of each set of sinuous bridges respectively integrally formed at one end with the lead extension structures for adjacent sides defining a respective corner of said inner lead frame portion and integrally formed at the opposite end with said outer frame; and
   said first sinuous bridge of each set being integrally formed at one end with said marginal rim at a respective corner of said inner lead portion and integrally formed at the opposite end with said outer frame.

4. A lead frame as set forth in claim 3, wherein at least one corner of said inner lead frame portion directly integrally merges with said outer frame, said inner lead frame portion being otherwise connected to said outer frame only through said sets of first, second, and third sinuous bridges located at each of said at least some of the corners of said inner lead frame portion.

* * * * *